US008391019B2

(12) United States Patent
Kuroda et al.

(10) Patent No.: US 8,391,019 B2
(45) Date of Patent: Mar. 5, 2013

(54) CONNECTION TERMINAL AND AC ADAPTER

(75) Inventors: Masatoshi Kuroda, Tokyo (JP); Toru Yoshino, Tokyo (JP); Eiji Yoshida, Tokyo (JP); Hirotaka Yamamoto, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 270 days.

(21) Appl. No.: 12/875,275

(22) Filed: Sep. 3, 2010

(65) Prior Publication Data

US 2011/0058345 A1 Mar. 10, 2011

(30) Foreign Application Priority Data

Sep. 8, 2009 (JP) ................................ 2009-206710

(51) Int. Cl.
*H05K 7/14* (2006.01)

(52) U.S. Cl. ........................................................ 361/802

(58) Field of Classification Search .................. 361/802, 361/725, 727, 752, 829; 439/131, 166, 171, 439/172, 816

See application file for complete search history.

(56) References Cited

U.S. PATENT DOCUMENTS 6,179,633 B1 1/2001 Inada

FOREIGN PATENT DOCUMENTS

JP 11-224717 8/1999

*Primary Examiner* — Jeremy Norris
*Assistant Examiner* — Tremesha S Willis
(74) *Attorney, Agent, or Firm* — IPUSA, PLLC

(57) ABSTRACT

A connection terminal includes a frame body including first and second support parts positioned to face each other; and a third support part having first and second ends connected to an end of the first support part and an end of the second support part, respectively; first elastic contact pieces provided on the first support part on a first side from which a terminal is to be inserted and having respective first contact parts configured to contact a peripheral surface of the terminal; second elastic contact pieces provided on the second support part on the first side and having respective second contact parts configured to contact the peripheral surface of the terminal and positioned to face the first contact parts; and a third elastic contact piece provided on the frame body on a second side opposite to the first side and configured to contact an end portion of the terminal.

4 Claims, 9 Drawing Sheets

CONNECTION TERMINAL AND AC ADAPTER

CROSS-REFERENCE TO RELATED APPLICATION

The present application is based upon and claims the benefit of priority of Japanese Patent Application No. 2009-206710, filed on Sep. 8, 2009, the entire contents of which are incorporated herein by reference.

BACKGROUND OF THE INVENTION

1. Field of the Invention

The present invention relates to a connection terminal that electrically connects to a terminal by coming into contact with the terminal, and to an AC adapter including the connection terminal.

2. Description of the Related Art

AC adapters that supply power to electronic apparatuses (such as portable electronic devices) include AC adapters usable worldwide with commercial supply voltages of various regions. (See, for example, FIG. 1.)

FIG. 1 is an exploded plan view of a conventional AC adapter.

Referring to FIG. 1, a conventional AC adapter 200 includes a power supply plug 201, an upper case 202, a circuit board 204, electronic components 205, connection terminals 207, and a DC cord 208.

The power supply plug 201 includes a lower case 211 and pin plugs 212, which are terminals. The lower case 211 has an attachment groove part (not graphically illustrated) for attachment of the circuit board 204.

Each of the pin plugs 212 has a rod shape, and has an outlet insertion part 215 at one end and a connection part 216 at the other end. The outlet insertion part 215, which is configured to be inserted into an outlet, is exposed outside the lower case 211. The connection part 216, which is configured to be held by the corresponding connection terminal 207, projects from the interior wall of the lower case 211.

The upper case 202 includes a housing part 218 for housing the circuit board 204 on which the electronic components 205 and the connection terminals 207 are mounted. The upper case 202 further includes a pair of guides 219 configured to guide the circuit board 204.

FIG. 2 is a partial cross-sectional view of the structure of FIG. 1, taken along the line and in the direction indicated by arrows J.

Referring to FIG. 2, the circuit board 204 includes a board body 222 having a mounting surface 222A; an interconnection pattern 223 provided on a surface 222B of the board body 222 on the opposite side from the mounting surface 222A; and a solder resist layer 224 having an opening 224A that exposes part of the interconnection pattern 223 that corresponds to a region where solder 226 is formed.

Referring back to FIG. 1, the electronic components 205 are mounted on the mounting surface 222A of the board body 222. The electronic components 205 are electrically connected to the interconnection pattern 223.

Examples of the electronic components 205 include a capacitor, a transformer, and a switching device.

Referring to FIG. 1 and FIG. 2, the connection terminals 207 are provided in part of the peripheral part of the circuit board 204 which part faces the power supply plug 201. The connection terminals 207 are provided at such positions as to allow the connection terminals 207 to hold the connection parts 216 of the corresponding pin plugs 212. Each of the connection terminals 207 includes a fixing part 231 and a pair of elastically deformable pieces 233.

The fixing part 231 includes a support part 235 that supports the elastically deformable pieces 233, and an electrical connection part 236 that penetrates through the board body 222 and the interconnection pattern 223. The electrical connection part 236 is fixed to the interconnection pattern 223 with the solder 226. Thereby, the connection terminals 207 are electrically connected to the circuit board 204.

FIG. 3 is a cross-sectional view schematically illustrating the connection terminal 207 holding the connection part 216 of the corresponding pin plug 212. FIG. 4 is a diagram illustrating the structure illustrated in FIG. 3 viewed in the direction indicated by arrow K. In FIG. 3 and FIG. 4, the same elements as those of the structure illustrated in FIG. 2 are referred to by the same numerals.

Referring to FIG. 3 and FIG. 4, the elastically deformable pieces 233 are provided on the support part 235 so as to face each other. The elastically deformable pieces 233 include respective contact parts 238 that project toward the center of the elastically deformable pieces 233. The contact parts 238 electrically connect the circuit board 204 and the pin plug 212 by holding the connection part 216 of the pin plug 212 inserted in the connection terminal 207.

Referring to FIG. 1, the DC cord 208 has one end connected to the circuit board 204. Thereby, the DC cord 208 is electrically connected to the electronic components 205, the connection terminals 207, and the circuit board 204. The DC cord 208 has, at the other end, a plug 241 to be connected to an electronic apparatus (not graphically illustrated).

The AC adapter 200 configured as described above converts alternating current (AC) power into direct current (DC) power, and supplies the DC power to the electronic apparatus (not graphically illustrated). (See, for example, Japanese Laid-Open Patent Application No. 11-224717.)

SUMMARY OF THE INVENTION

According to one aspect of the present invention, a connection terminal to electrically connect to a terminal by holding the terminal includes a frame body including a first support part and a second support part positioned to face each other; and a third support part having a first end and a second end connected to an end of the first support part and an end of the second support part, respectively; a plurality of first elastic contact pieces provided on the first support part on a first side from which the terminal is to be inserted and having respective first contact parts configured to contact a peripheral surface of the terminal; a plurality of second elastic contact pieces provided on the second support part on the first side and having respective second contact parts configured to contact the peripheral surface of the terminal, the second contact parts being positioned to face the first contact parts; and a third elastic contact piece provided on the frame body on a second side opposite to the first side and configured to contact an end portion of the terminal.

According to one aspect of the present invention, an AC adapter includes the connection terminal as set forth above; a circuit board having an interconnection pattern; an electronic component mounted on the circuit board; a power supply plug including a first case and a pin plug penetrating through the first case, the first case being attached to the circuit board; and a second case attached to the power supply plug, the second case including a housing part configured to house the circuit board having the electronic component mounted thereon, wherein the connection terminal is provided on the circuit board so that the pin plug faces the third elastic contact piece and is electrically connected to the interconnection pattern, and the connection terminal holds the pin plug so that the first contact parts, the second contact parts, and the third elastic contact piece are in contact with the end portion of the pin plug.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

Figure 1:
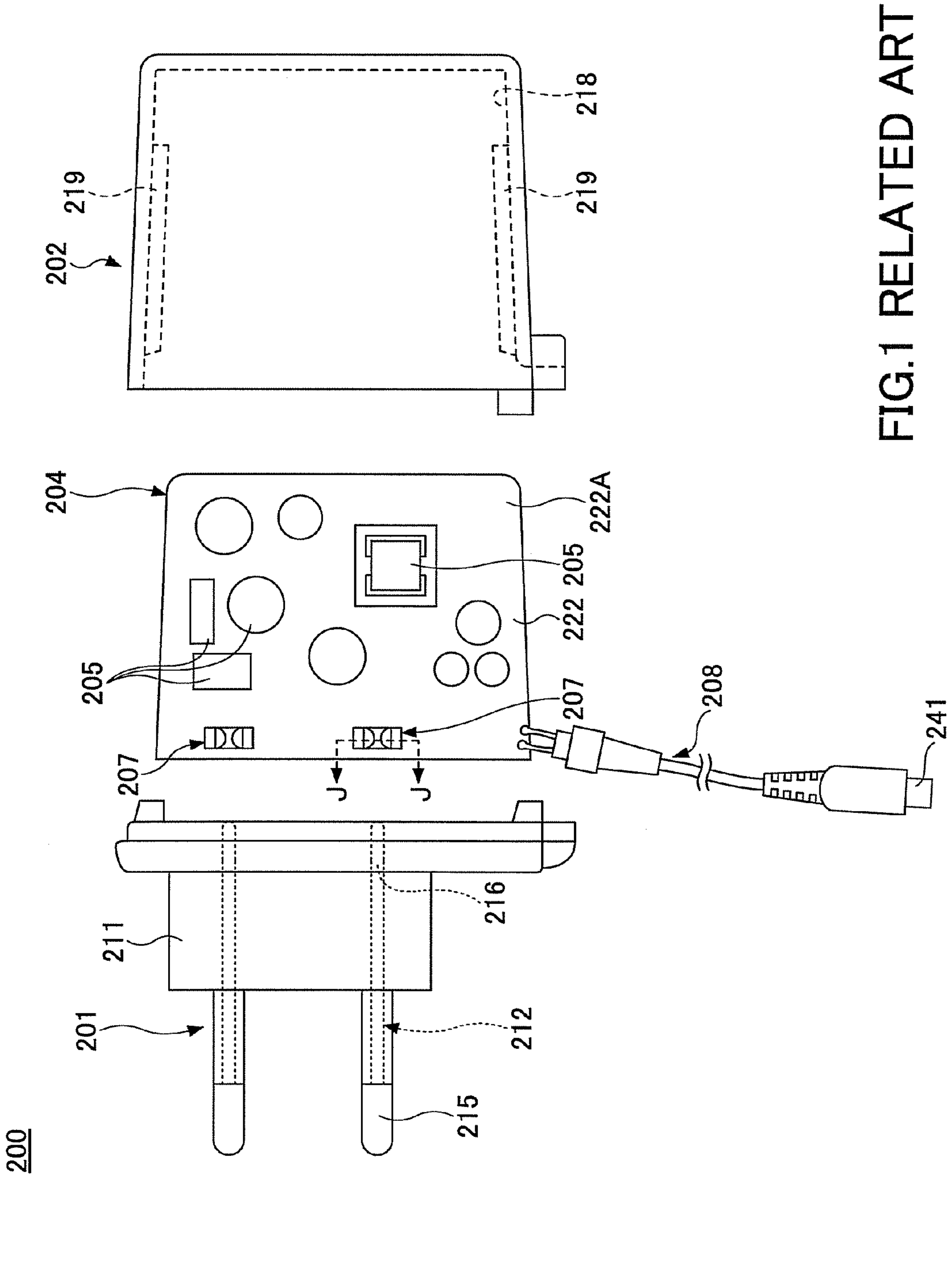
FIG.1 RELATED ART
FIG. 1 is an exploded plan view of a conventional AC adapter.
Figure 2:
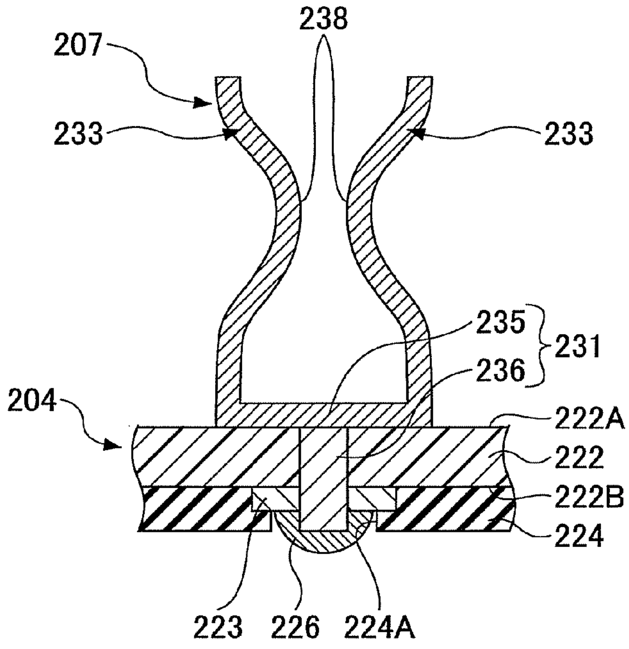
FIG.2 RELATED ART
FIG. 2 is a partial cross-sectional view of the structure of FIG. 1, taken along the line and in the direction indicated by arrows J.
Figure 3:
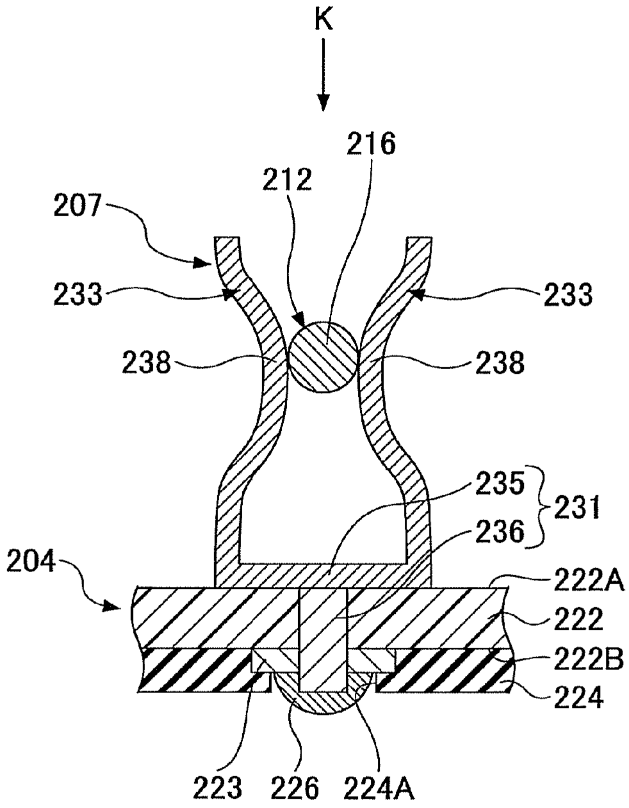
FIG.3 RELATED ART
FIG. 3 is a cross-sectional view schematically illustrating a connection terminal holding the connection part of a corresponding pin plug.
Figure 4:
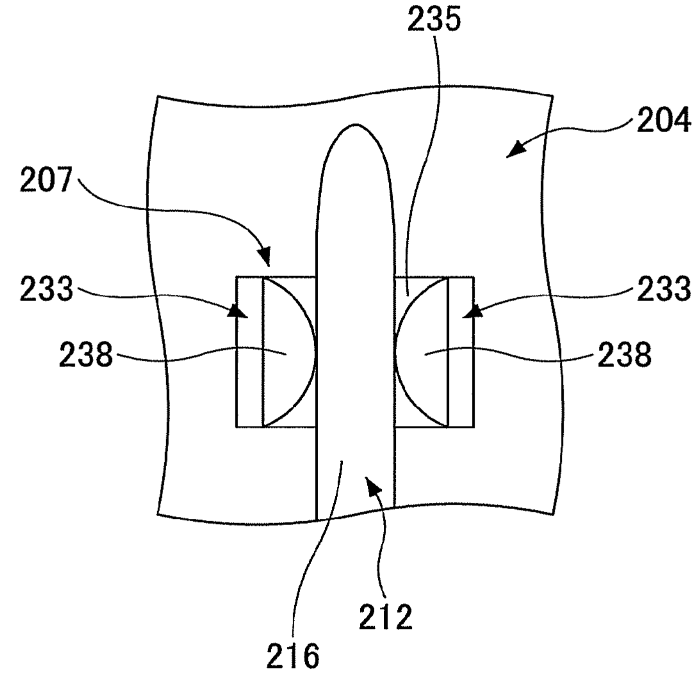
FIG.4 RELATED ART
FIG. 4 is a diagram illustrating the structure illustrated in FIG. 3 viewed in the direction indicated by arrow K.
Figure 5:
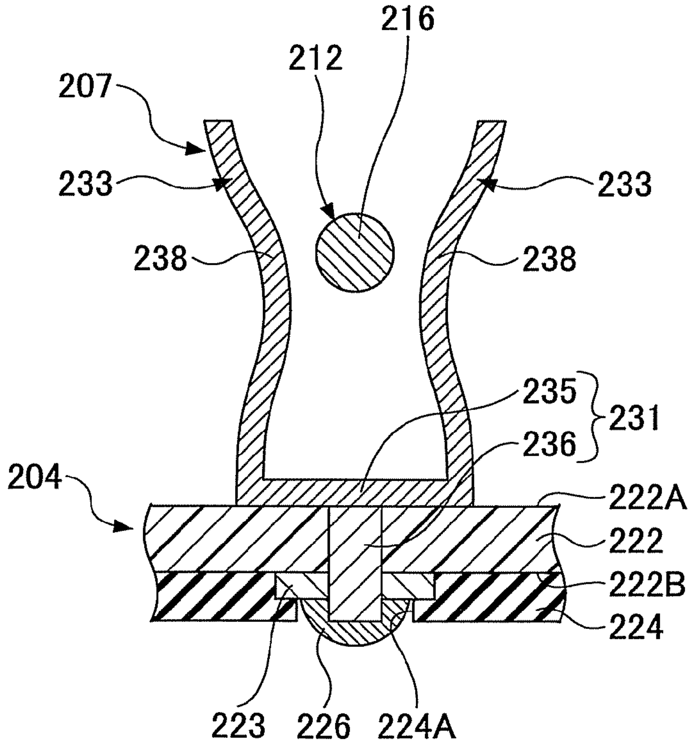
FIG.5 RELATED ART
FIG. 5 is a diagram for illustrating a problem of the conventional connection terminal.

FIG. 5 is a diagram for illustrating a problem of the conventional connection terminal.

According to the conventional connection terminal 207, if a force greater than or equal to a certain value is applied to the elastically deformable pieces 233, the elastically deformable pieces 233 remain deformed (spread outward).

Therefore, as illustrated in FIG. 5, contact failure is caused between the connection part 216 of the pin plug 212 and the elastically deformable pieces 233, thus causing the problem of reduction in the reliability of the electrical connection between the connection terminal 207 and the pin plug 212.

According to one aspect of the present invention, a connection terminal and an AC adapter are provided that can increase the reliability of the electrical connection between a terminal and a connection terminal by ensuring the holding of the terminal inserted in the connection terminal.

A description is given below, with reference to the accompanying drawings, of an embodiment of the present invention.

Figure 6:
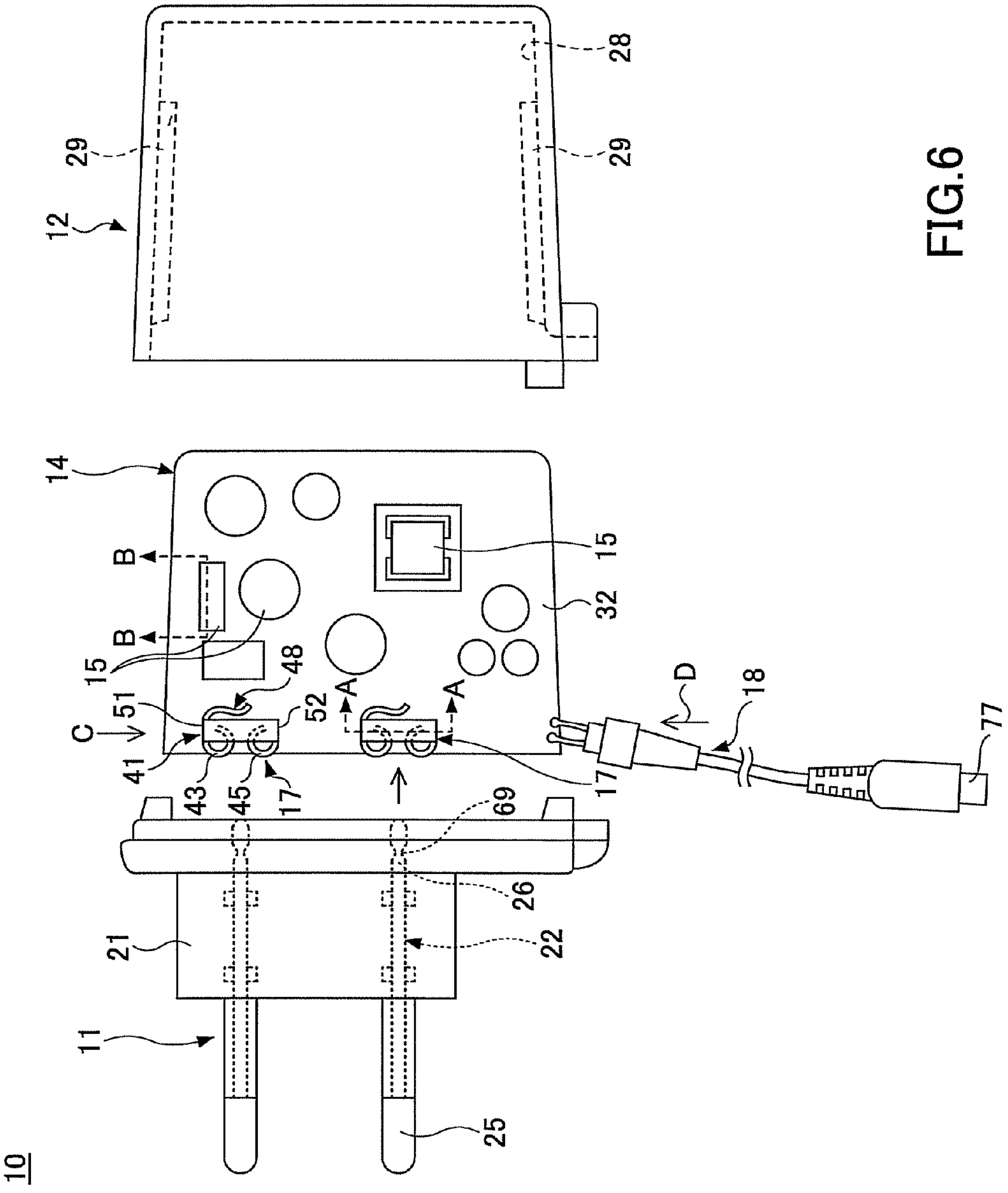
FIG. 6 is an exploded plan view of an AC adapter according to an embodiment of the present invention.

FIG. 6 is an exploded plan view of an AC adapter according to the embodiment of the present invention.

Referring to FIG. 6, an AC adapter 10 according to this embodiment includes a power supply plug 11, an upper case 12, a circuit board 14, electronic components 15, connection terminals 17, and a DC cord 18.

The power supply plug 11 includes a lower case 21 and pin plugs 22, which are terminals. The lower case 21 has an attachment groove part (not graphically illustrated) for attachment of the circuit board 14.

Each of the pin plugs 22 has a rod shape, and has an outlet insertion part 25 at one end and a connection part 26 at the other end. The outlet insertion part 25, which is configured to be inserted into an outlet, is exposed outside the lower case 21. The connection part 26, which is configured to be held by the corresponding connection terminal 17, projects from the interior wall of the lower case 21.

The upper case 12 includes a housing part 28 for housing the circuit board 14 on which the electronic components 15 and the connection terminals 17 are mounted. The upper case 12 further includes a pair of guides 29 configured to guide the circuit board 14.

Figure 7:
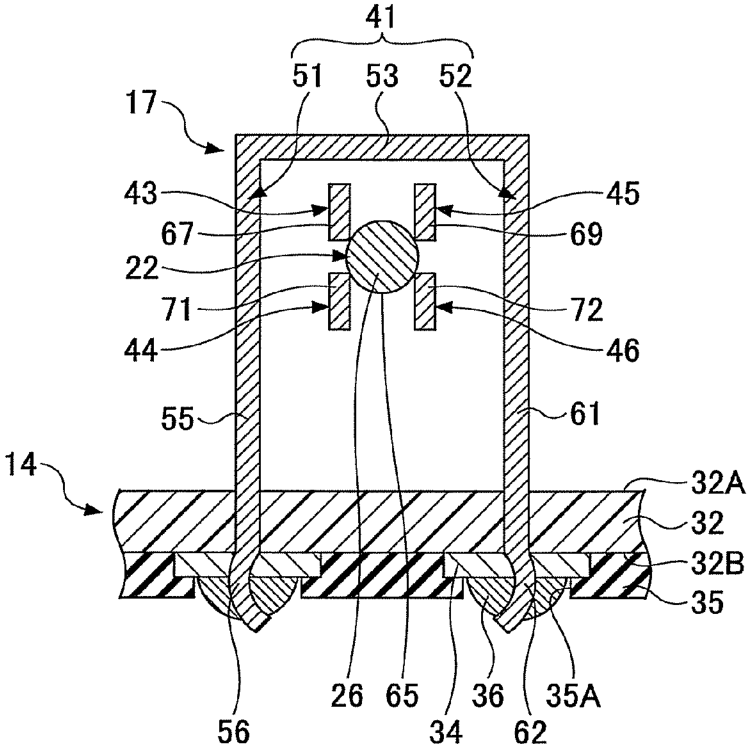
FIG. 7 is a schematic partial cross-sectional view of the structure of FIG. 6, taken along the line and in the direction indicated by arrows A, according to the embodiment of the present invention.
Figure 8:
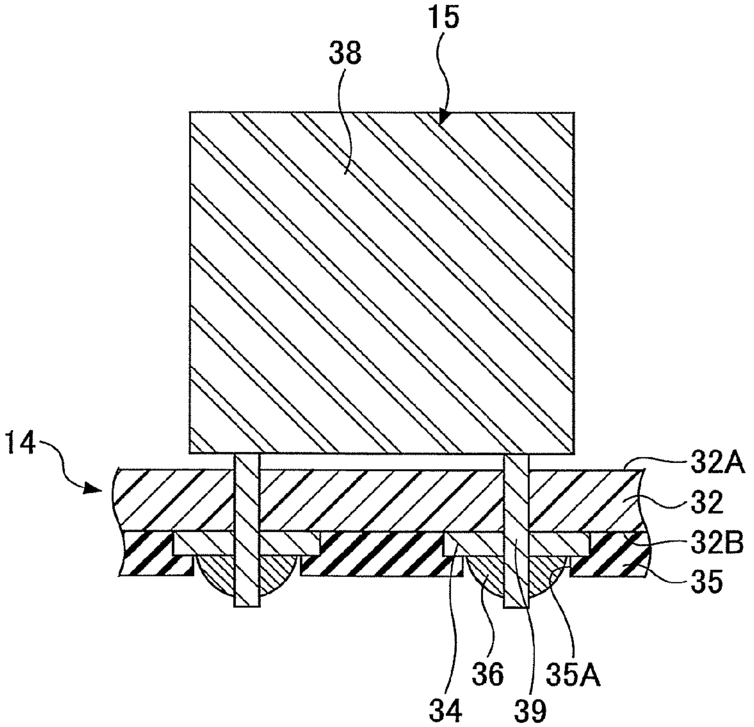
FIG. 8 is a partial cross-sectional view of the structure of FIG. 6, taken along the line and in the direction indicated by arrows B, according to the embodiment of the present invention.

FIG. 7 is a schematic partial cross-sectional view of the structure of FIG. 6, taken along the line and in the direction indicated by arrows A. FIG. 8 is a partial cross-sectional view of the structure of FIG. 6, taken along the line and in the direction indicated by arrows B. In FIGS. 7 and 8, the same elements as those of the AC adapter 10 of this embodiment illustrated in FIG. 6 are referred to by the same numerals. For convenience of description, FIG. 7 schematically illustrates the connection terminal 17 in the state of holding the connection part 26 of the corresponding pin plug 22.

Referring to FIG. 7 and FIG. 8, the circuit board 14 includes a board body 32, interconnection patterns 34, and a solder resist layer 35.

The board body 32 is a plate-shaped substrate. The board body 32 has a mounting surface 32A, on which the electronic components 15 and the connection terminals 17 are mounted, and a surface 32B positioned on the opposite side (facing away) from the mounting surface 32A. Examples of the board body 32 include a phenolic substrate, a paper epoxy substrate, and a glass epoxy substrate.

The interconnection patterns 34 are framed on the surface 32B of the board body 32. The solder resist layer 35 is formed on the surface 32B of the board body 32. The solder resist layer 35 has openings 35A that expose parts of the interconnection patterns 34 that correspond to regions where solder 36 is formed.

Referring to FIG. 8, the electronic component 15 includes an electronic component body 38 and pin terminals 39. The electronic component body 38 is placed on the mounting surface 32A of the board body 32. The pin terminals 39 are provided at the lower end of the electronic component body 38. The pin terminals 39 are electrically connected to the electronic component body 38. The pin terminals 39 penetrate through the board body 32 and the interconnection patterns 34. Portions of the pin terminals 39 projecting from the interconnection patterns 34 are fixed to the circuit board 14 with the solder 36 provided on the parts of the interconnection patterns 34 exposed in openings 35A. Examples of the electronic components 15 include a capacitor, a transformer, and a switching device.

Figure 9:
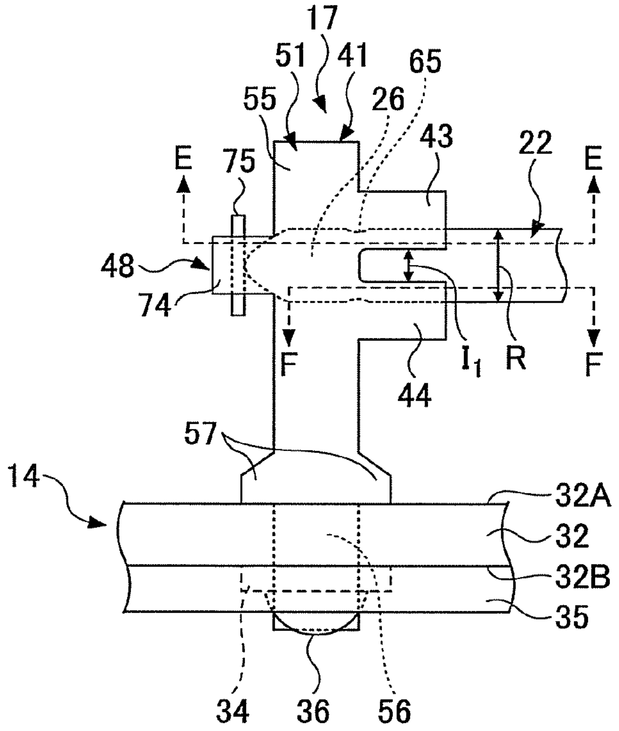
FIG. 9 is a diagram illustrating a connection terminal viewed in the direction indicated by arrow C in FIG. 6 according to the embodiment of the present invention.

FIG. 9 is a diagram illustrating the connection terminal 17 viewed in the direction indicated by arrow C in FIG. 6. In FIG. 9, the same elements as those of the AC adapter 10 illustrated in FIG. 6 are referred to by the same numerals. For convenience of description, FIG. 9 schematically illustrates the connection terminal 17 in the state of holding the connection part 26 of the corresponding pin plug 22.

Referring to FIG. 6, FIG. 7, and FIG. 9, the connection terminals 17 are provided on the mounting surface 32A of the board body 32 in part of the peripheral part of the circuit board 14. The connection terminals 17 are provided at such positions as to allow the connection terminals 17 to hold the connection parts 26 of the corresponding pin plugs 22.

Each of the connection terminals 17 includes a frame body 41, a pair of first elastic contact pieces 43 and 44, a pair of second elastic contact pieces 45 and 46, and a third elastic contact piece 48.

The frame body 41 includes a first support part 51, a second support part 52, and a third support part 53. The first support part 51 has a plate shape, and includes an elastic contact pieces forming part 55, an insertion part 56, and a pair of projecting parts 57.

The elastic contact pieces forming part 55 is positioned on the mounting surface 32A of the board body 32. That is, the elastic contact pieces forming part 55 extends upward from the mounting surface 32A of the board body 32. The first elastic contact pieces 43 and 44 are connected to the elastic contact pieces forming part 55. One end of the elastic contact pieces forming part 55 (one end of the first support part 51) is connected to one end (a first end) of the third support part 53. The elastic contact pieces forming part 55 is formed as a unit with the third support part 53. The angle formed between the elastic contact pieces forming part 55 and the third support part 53 may be, for example, 90 degrees.

The insertion part 56 is provided at the other end of the elastic contact pieces forming part 55. The insertion part 56 penetrates through the board body 32 and the corresponding interconnection pattern 34. A portion of the insertion part 56 projecting from the interconnection pattern 34 is bent so as to prevent the connection terminal 17 from coming off the circuit board 14. The portion of the insertion part 56 projecting from the interconnection pattern 34 is fixed to the interconnection pattern 34 with the solder 36.

The projecting parts 57 are provided on portions of the elastic contact pieces forming part 55 near the insertion part 56. The projecting parts 57 prevent the insertion of the elastic contact pieces forming part 55 into the board body 32.

Figure 10:
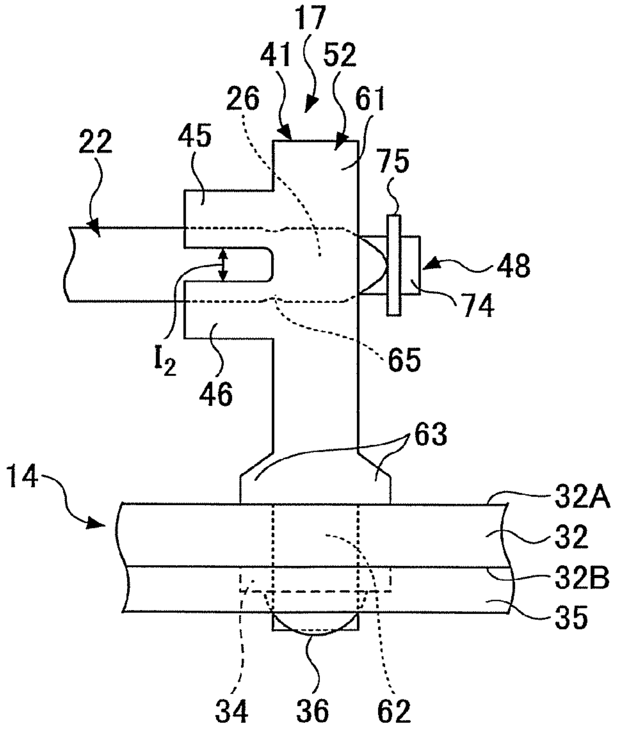
FIG. 10 is a diagram illustrating the connection terminal viewed in the direction indicated by arrow D in FIG. 6 according to the embodiment of the present invention.

FIG. 10 is a diagram illustrating the connection to/urinal 17 viewed in the direction indicated by arrow D in FIG. 6. In FIG. 10, the same elements as those of the AC adapter 10 illustrated in FIG. 6 are referred to by the same numerals. For convenience of description, FIG. 10 schematically illustrates the connection terminal 17 in the state of holding the connection part 26 of the corresponding pin plug 22.

Referring to FIG. 7 and FIG. 10, the second support part 52 has a plate shape, and is positioned on the circuit board 14 to face the first support part 51. The second support part 52 includes an elastic contact pieces forming part 61, an insertion part 62, and a pair of projecting parts 63.

The elastic contact pieces forming part 61 is positioned on the mounting surface 32A of the board body 32. That is, the elastic contact pieces forming part 61 extends upward from the mounting surface 32A of the board body 32. The second elastic contact pieces 45 and 46 are connected to the elastic contact pieces forming part 61. One end of the elastic contact pieces forming part 61 (one end of the second support part 52) is connected to the other end (a second end) of the third support part 53. The elastic contact pieces forming part 61 is formed as a unit with the third support part 53. The angle formed between the elastic contact pieces forming part 61 and the third support part 53 may be, for example, 90 degrees.

The insertion part 62 is provided at the other end of the elastic contact pieces forming part 61. The insertion part 62 penetrates through the board body 32 and the corresponding interconnection pattern 34. A portion of the insertion part 62 projecting from the interconnection pattern 34 is bent so as to prevent the connection terminal 17 from coming off the circuit board 14. The portion of the insertion part 62 projecting from the interconnection pattern 34 is fixed to the interconnection pattern 34 with the solder 36.

The projecting parts 63 are provided on portions of the elastic contact pieces forming part 61 near the insertion part 62. The projecting parts 63 prevent the insertion of the elastic contact pieces forming part 61 into the board body 32.

The second support part 52 configured as described above has the same shape as the first support part 51.

The third support part 53 is provided so as to connect the end of the elastic contact pieces forming part 55 (on the side opposite from the side on which the elastic contact pieces forming part 55 is mounted on the circuit board 14) and the end of the elastic contact pieces forming part 61 (on the side opposite from the side on which the elastic contact pieces forming part 61 is mounted on the circuit board 14). The first end of the third support part 53 is formed as a unit with the end of the elastic contact pieces forming part 55. The second end of the third support part 53 is formed as a unit with the end of the elastic contact pieces forming part 61. The frame body 41 configured as described above may have, for example, an angular C-letter shape.

By thus providing the third support part 53 connecting the end of the elastic contact pieces forming part 55 on the side opposite from the side on which the elastic contact pieces forming part 55 is mounted on the circuit board 14 and the end of the elastic contact pieces forming part 61 on the side opposite from the side on which the elastic contact pieces forming part 61 is mounted on the circuit board 14, the interval between the elastic contact pieces forming part 55 where the first elastic contact pieces 43 and 44 are formed and the elastic contact pieces forming part 61 where the second elastic contact pieces 45 and 46 are formed is prevented from widening. Therefore, it is possible to hold the peripheral surface of the connection part 26 of the pin plug 22 tightly between the first elastic contact pieces 43 and 44 and the second elastic contact pieces 45 and 46.

Figure 11:
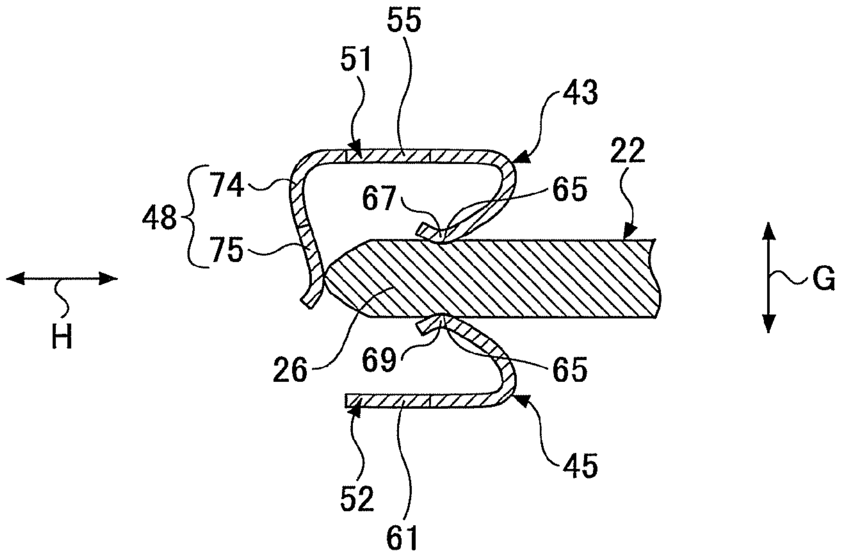
FIG. 11 is a cross-sectional view of the connection terminal illustrated in FIG. 9, taken along the line and in the direction indicated by arrows E, according to the embodiment of the present invention.

FIG. 11 is a cross-sectional view of the connection terminal 17 illustrated in FIG. 9, taken along the line and in the direction indicated by arrows E. In FIG. 11, the same elements as those of the AC adapter 10 illustrated in FIG. 6, FIG. 9, and FIG. 10 are referred to by the same numerals. In FIG. 11, the same elements as those of the structures illustrated in FIG. 9 and FIG. 10 are referred to by the same numerals.

Referring to FIG. 9 through FIG. 11, the first elastic contact piece 43 is provided on a sidewall of the elastic contact pieces forming part 55 positioned on the side from which the connection part 26 of the corresponding pin plug 22 is inserted. The first elastic contact piece 43 is formed as a unit with the elastic contact pieces forming part 55.

The first elastic contact piece 43 has a curved shape to project in a direction toward the second elastic contact piece 45. The first elastic contact piece 43 has a spring characteristic so as to be displaceable in the directions indicated by G in FIG. 11 (the directions in which the elastic contact pieces forming parts 55 and 61 are arranged). The first elastic contact piece 43 has a first contact part 67 configured to come into contact with the peripheral surface of a recess 65 formed in the connection part 26 of the corresponding pin plug 22. The first contact part 67 is provided in an end part of the first elastic contact piece 43 on the side (free-end side) opposite to the side on which the first elastic contact piece 43 is connected to the elastic contact pieces forming part 55. The first contact part 67 is provided in part of the first elastic contact piece 43 where the interval between the first elastic contact piece 43 and the second elastic contact piece 45 is narrowest. The first contact part 67 has a shape corresponding to the shape of the recess 65. The recess 65 may have a rounded shape, for example.

Referring to FIG. 9 through FIG. 11, the second elastic contact piece 45 is provided on a sidewall of the elastic contact pieces forming part 61 positioned on the side from which the connection part 26 of the corresponding pin plug 22 is inserted. The second elastic contact piece 45 is formed as a unit with the elastic contact pieces forming part 61.

The second elastic contact piece 45 has a curved shape to project in a direction toward the first elastic contact piece 43. The second elastic contact piece 45 has a spring characteristic so as to be displaceable in the directions indicated by G in FIG. 11 (the directions in which the elastic contact pieces forming parts 55 and 61 are arranged). The second elastic contact piece 45 has a second contact part 69 configured to come into contact with the peripheral surface of the recess 65 formed in the connection part 26. The second contact part 69 is provided in an end part of the second elastic contact piece 45 on the side (free-end side) opposite to the side on which the second elastic contact piece 45 is connected to the elastic contact pieces forming part 61. The second contact part 69 is provided in part of the second elastic contact piece 45 where the interval between the first elastic contact piece 43 and the second elastic contact piece 45 is narrowest. The second contact part 69 is positioned to face the first contact part 67.

As illustrated in FIG. 7, upon insertion of the connection part 26 of the pin plug 22 into the connection terminal 17, the first elastic contact piece 43 and the second elastic contact piece 45 described above come into contact with the recess 65 at two points in the upper half of the connection part 26. At this point, since the first elastic contact piece 43 and the second elastic contact piece 45 have a spring characteristic, the first elastic contact piece 43 and the second elastic contact piece 45 are in contact with the connection part 26 with a predetermined pressure.

Figure 12:
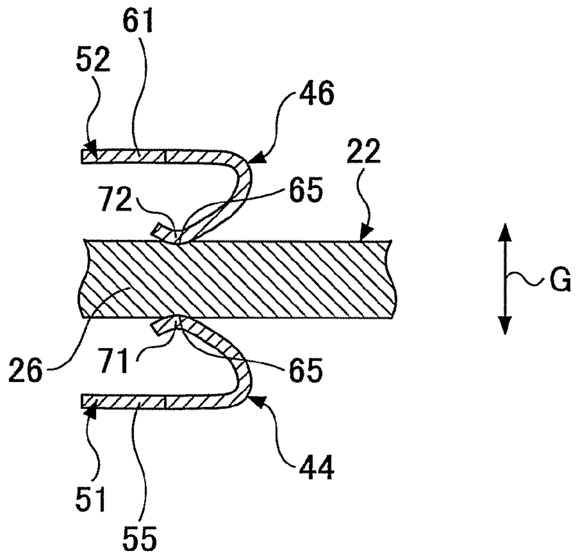
FIG. 12 is a cross-sectional view of the connection terminal illustrated in FIG. 9, taken along the line and in the direction indicated by arrows F, according to the embodiment of the present invention.

FIG. 12 is a cross-sectional view of the connection terminal 17 illustrated in FIG. 9, taken along the line and in the direction indicated by arrows F. In FIG. 12, the same elements as those of the structures illustrated in FIG. 6 through FIG. 11 are referred to by the same numerals.

Referring to FIG. 9, FIG. 10, and FIG. 12, the first elastic contact piece 44 is provided on the sidewall of the elastic contact pieces forming part 55 positioned on the side from which the connection part 26 of the corresponding pin plug 22 is inserted. The first elastic contact piece 44 is positioned below the first elastic contact piece 43. A gap $I_1$ between the first elastic contact piece 43 and the first elastic contact piece 44 is smaller than a diameter R of the pin plug 22. If the diameter R of the pin plug 22 is 1 mm, the gap $I_1$ between the first elastic contact piece 43 and the first elastic contact piece 44 may be, for example, 0.7 mm. The first elastic contact piece 44 is formed as a unit with the elastic contact pieces forming part 55.

The first elastic contact piece 44 has a curved shape to project in a direction toward the second elastic contact piece 46. The first elastic contact piece 44 has a spring characteristic so as to be displaceable in the directions indicated by G in FIG. 12 (the directions in which the elastic contact pieces forming parts 55 and 61 are arranged). The first elastic contact piece 44 has a first contact part 71 configured to come into contact with the peripheral surface of the recess 65 formed in the connection part 26 of the corresponding pin plug 22. The first contact part 71 is provided in an end part of the first elastic contact piece 44 on the side (free-end side) opposite to the side on which the first elastic contact piece 44 is connected to the elastic contact pieces forming part 55. The first contact part 71 is provided in part of the first elastic contact piece 44 where the interval between the first elastic contact piece 44 and the second elastic contact piece 46 is narrowest. The first contact part 71 has a shape corresponding to the shape of the recess 65.

Referring to FIG. 9, FIG. 10, and FIG. 12, the second elastic contact piece 46 is provided on the sidewall of the elastic contact pieces forming part 61 positioned on the side from which the connection part 26 of the corresponding pin plug 22 is inserted. The second elastic contact piece 46 is positioned below the second elastic contact piece 45. A gap $I_2$ between the second elastic contact piece 45 and the second elastic contact piece 46 is smaller than the diameter R of the pin plug 22. If the diameter R of the pin plug 22 is 1 mm, the gap $I_2$ between the second elastic contact piece 45 and the second elastic contact piece 46 may be, for example, 0.7 mm. The second elastic contact piece 46 is formed as a unit with the elastic contact pieces forming part 61.

The second elastic contact piece 46 has a curved shape to project in a direction toward the first elastic contact piece 44. The second elastic contact piece 46 has a spring characteristic so as to be displaceable in the directions indicated by G in FIG. 12 (the directions in which the elastic contact pieces forming parts 55 and 61 are arranged). The second elastic contact piece 46 has a second contact part 72 configured to come into contact with the peripheral surface of the recess 65 formed in the connection part 26. The second contact part 72 is provided in an end part of the second elastic contact piece 46 on the side (free-end side) opposite to the side on which the second elastic contact piece 46 is connected to the elastic contact pieces forming part 61. The second contact part 72 is provided in part of the second elastic contact piece 46 where the interval between the first elastic contact piece 44 and the second elastic contact piece 46 is narrowest. The second contact part 72 is positioned to face the first contact part 71.

As illustrated in FIG. 7, upon insertion of the connection part 26 of the pin plug 22 into the connection terminal 17, the first elastic contact piece 44 and the second elastic contact piece 46 described above come into contact with the recess 65 at two points in the lower half of the connection part 26. At this point, since the first elastic contact piece 44 and the second elastic contact piece 46 have a spring characteristic, the first elastic contact piece 44 and the second elastic contact piece 46 are in contact with the connection part 26 with a predetermined pressure.

By thus providing the first elastic contact piece 43 and the second elastic contact piece 45, configured to come into contact with the recess 65 in the upper half of the connection part 26, and the first elastic contact piece 44 and the second elastic contact piece 46, configured to come into contact with the recess 65 in the lower half of the connection part 26, on the sidewalls of the frame body 41 positioned on the side from which the pin plug 22 is inserted, the connection part 26 of the pin plug 22 can be held circumferentially at four points as illustrated in FIG. 7. Accordingly, it is possible to increase the reliability of the electrical connection between the connection terminal 17 and the corresponding pin plug 22.

Referring to FIG. 9 and FIG. 11, the third elastic contact piece 48 has a spring characteristic so as to be displaceable in the directions indicated by H in FIG. 11 (directions perpendicular to the directions indicated by G in FIG. 11). The third elastic contact piece 48 includes a support part 74 and a contact part 75.

The support part 74 has a curved shape. The support part 74 has a first end connected to the other sidewall of the elastic contact pieces forming part 55 (positioned on the side opposite from the sidewall of the elastic contact pieces forming part 55 on which the first elastic contact pieces 43 and 44 are provided). The first end of the support part 74 is formed as a unit with the other sidewall of the elastic contact pieces forming part 55.

The contact part 75 is connected to a second end of the support part 74. The contact part 75 is formed as a unit with the support part 74. The contact part 75 is in contact with the end or end portion of the connection part 26 of the pin plug 22 with a predetermined pressure.

By thus providing the third elastic contact piece 48 configured to come into contact with the end of the connection part 26 of the pin plug 22, it is possible to restrict the position of the end of the connection part 26 of the pin plug 22 in the H directions (directions perpendicular to the directions indicated by G in FIG. 11). Accordingly, it is possible to increase the reliability of the electrical connection between the connection terminal 17 and the corresponding pin plug 22.

The connection terminals 17 configured as described above may be formed by, for example, stamping plate material and bending the stamped plate material. In this case, examples of the plate material include a thin phosphor bronze plate (for example, 0.2 mm in thickness) whose surfaces are plated with a Ni film (for example, 1 μm to 3 μm in thickness).

Referring to FIG. 6, the DC cord 18 is attached to the circuit board 14. The DC cord 18 is electrically connected to the interconnection patterns 34 provided on the circuit board 14. The DC cord 18 includes a plug 77 to be connected to an electronic apparatus (not graphically illustrated). The DC cord 18 is led outside the upper case 12 and the lower case 21 through a through hole (not graphically illustrated) formed by the attachment of the lower case 21 to the upper case 12.

The AC adapter 10 configured as described above converts AC power supplied to the power supply plug 11 into DC power, and supplies the DC power to the electronic apparatus (not graphically illustrated).

According to the AC adapter 10 of this embodiment, by providing the frame body 41 having an angular C-letter shape and fixed to the circuit board 14; the first elastic contact pieces 43 and 44 and the second elastic contact pieces 45 and 46 provided on sidewalls of the frame body 41 positioned on a first side, from which the connection part 26 of the pin plug 22 is inserted, to hold the peripheral surface of the connection part 26 of the pin plug 22 between them by four-point contact; and the third elastic contact piece 48 provided on a sidewall of the frame body 41 positioned on a second side, opposite to the first side from which the connection part 26 of the pin plug 22 is inserted, to come into contact with the end of the connection part 26 of the pin plug 22, it is possible to hold the connection part 26 of the pin plug 22 at five points, and the first support part 51, on which the first elastic contact pieces 43 and 44 are provided, and the second support part 52, on which the second elastic contact pieces 45 and 46 are provided, are prevented from moving away from each other (in other words, the gap between the first elastic contact pieces 43 and 44 and the second elastic contact pieces 45 and 46 is prevented from becoming larger). Accordingly, it is possible to increase the reliability of the electrical connection between the connection terminal 17 and the pin plug 22 by ensuring the holding of the connection part 26 of the pin plug 22 by the connection terminal 17.

In this embodiment, by way of example, a description is given of the case where the third elastic contact piece 48 is provided on the first support part 51. The third elastic contact piece 48 may also be provided on either the second support part 52 or the third support part 53.

Further, in the case of providing the third elastic contact piece 48 on the first support part 51 and the second support part 52, the first support part 51 and the second support part 52 may be reduced in height (vertical length) with the third elastic contact piece 48 having a sufficient spring characteristic. Accordingly, it is possible to reduce the cost of the connection terminal.

Figure 13:
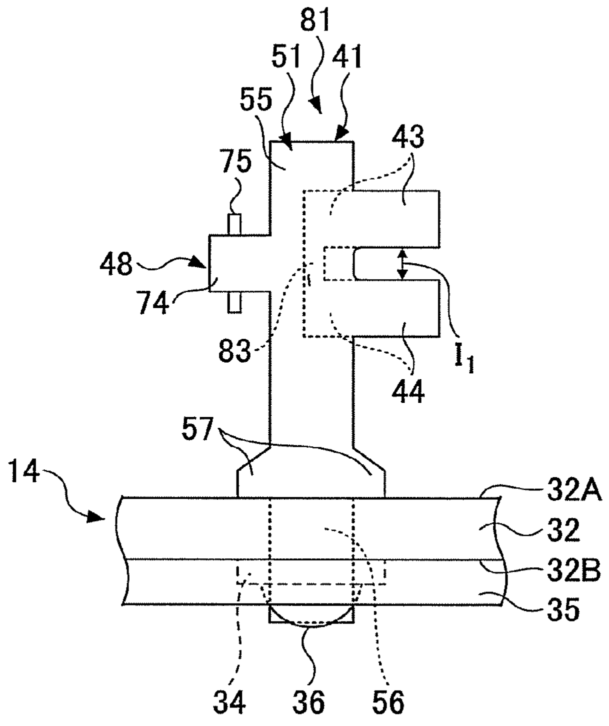
FIG. 13 is a side view of a connection terminal according to a variation of the embodiment of the present invention.
Figure 14:
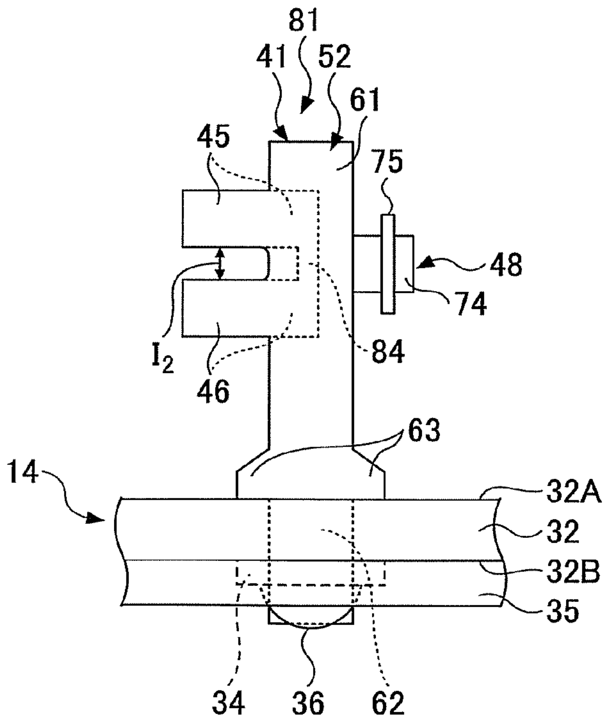
FIG. 14 is a side view of the connection terminal according to the variation of the embodiment of the present invention.

FIG. 13 and FIG. 14 are side views of a connection terminal according to a variation of this embodiment. In FIG. 13, the same elements as those of the structure illustrated in FIG. 9 are referred to by the same numerals. In FIG. 14, the same elements as those of the structure illustrated in FIG. 10 are referred to by the same numerals.

Referring to FIG. 13 and FIG. 14, a connection terminal 81 according to the variation of this embodiment has the same configuration as the connection terminal 17 except for further including a first support body 83 and a second support body 84 in addition to the configuration of the connection terminal 17 of this embodiment.

Referring to FIG. 13, the first support body 83 is provided between an end part of the first elastic contact piece 43 on the side (free-end side) opposite to the side on which the first elastic contact piece 43 is connected to the first support part 51 and an end part of the first elastic contact piece 44 on the side (free-end side) opposite to the side on which the first elastic contact piece 44 is connected to the first support part 51, and is connected to the end part of the first elastic contact piece 43 and the end part of the first elastic contact piece 44. The first support body 83 is formed as a unit with the first elastic contact pieces 43 and 44. The first support body 83 is a member that maintains the gap $I_1$ between the first elastic contact piece 43 and the first elastic contact piece 44 at a constant value.

Referring to FIG. 14, the second support body 84 is provided between an end part of the second elastic contact piece 45 on the side (free-end side) opposite to the side on which the second elastic contact piece 45 is connected to the second support part 52 and an end part of the second elastic contact piece 46 on the side (free-end side) opposite to the side on which the second elastic contact piece 46 is connected to the second support part 52, and is connected to the end part of the second elastic contact piece 45 and the end part of the second elastic contact piece 46. The second support body 84 is formed as a unit with the second elastic contact pieces 45 and 46. The first support body 84 is a member that maintains the gap $I_2$ between the second elastic contact piece 45 and the second elastic contact piece 46 at a constant value.

The connection terminal 81 configured as described above may be formed by, for example, stamping plate material and bending the stamped plate material. In this case, examples of the plate material include a thin phosphor bronze plate (for example, 0.2 mm in thickness) whose surfaces are plated with a Ni film (for example, 1 μm to 3 μm in thickness).

Figure 15:
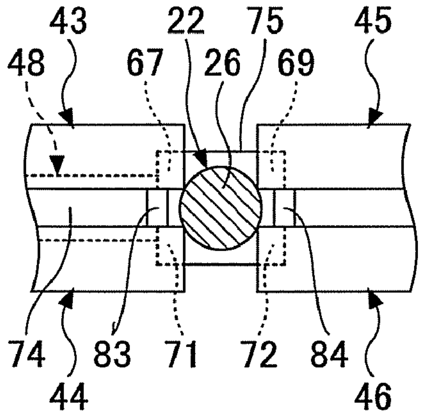
FIG. 15 is a schematic diagram illustrating a state where the connection terminal is in contact with a connection part of a pin plug according to the variation of the embodiment of the present invention.

FIG. 15 is a schematic diagram illustrating a state where the connection terminal 81 according to the variation of this embodiment is in contact with the connection part 26 of the pin plug 22. For convenience of description, in FIG. 15, the connection part 26 of the pin plug 22 is graphically illustrated in a cross section. Further, in FIG. 15, the same elements as those of the connection terminal 81 illustrated in FIG. 13 and FIG. 14 are referred to by the same numerals.

As illustrated in FIG. 15, according to the connection terminal 81 configured as described above, the connection part 26 of the pin plug 22 is held by the first contact parts 67 and 71, the second contact parts 69 and 72, and the contact part 75 without the first support body 83 and the second support body 84 contacting the pin plug 22.

According to the connection terminal 81 of the variation of this embodiment, by providing the first support body 83, formed as a unit with the first elastic contact pieces 43 and 44 and maintaining the gap between the first elastic contact piece 43 and the first elastic contact piece 44 at a constant value, and the second support body 84, formed as a unit with the second elastic contact pieces 45 and 46 and maintaining the gap $I_2$ between the second elastic contact piece 45 and the second elastic contact piece 46 at a constant value, the end parts of the first elastic contact pieces 43 and 44 are prevented from spreading, and the end parts of the second elastic contact pieces 45 and 46 are prevented from spreading. Accordingly, it is possible to ensure that the first contact parts 67 and 71 provided in the first elastic contact pieces 43 and 44, respectively, and the second contact parts 69 and 72 provided in the second elastic contact pieces 45 and 46, respectively, come into contact with the connection part 26 of the pin plug 22 (that is, it is possible to ensure the holding of the connection part 26 of the pin plug 22 by four-point contact). Therefore, it is possible to increase the reliability of the electrical connection between the connection terminal 81 and the corresponding pin plug 22.

A description is given above of a preferred embodiment of the present invention. The present invention, however, is not limited to the specifically disclosed embodiment, and variations and modifications may be made without departing from the scope of the present invention.

For example, the first elastic contact pieces 43 and 44 and the second elastic contact pieces 45 and 46 may individually vary in width. Specifically, for example, the first contact parts 67 and 71 and the second contact parts 69 and 72 may be larger in width than the remaining portions of the first elastic contact pieces 43 and 44 and the second elastic contact pieces 45 and 46, respectively.

Figure 16:
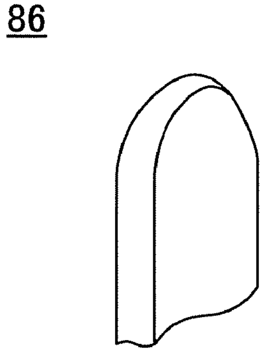
FIG. 16 is a perspective view of a blade, which is another terminal according to the embodiment of the present invention.
Figure 17:
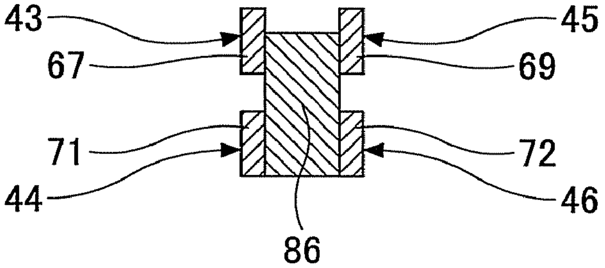
FIG. 17 is a schematic cross-sectional view of first elastic contact pieces, second contact pieces, and the blade illustrated in FIG. 16 held between the first elastic contact pieces and the second elastic contact pieces according to the embodiment of the present invention.

FIG. 16 is a perspective view of a blade 86, which is another terminal according to this embodiment. FIG. 17 is a schematic cross-sectional view of the first elastic contact pieces 43 and 44, the second contact pieces 45 and 46, and the blade 86 illustrated in FIG. 16 held between the first elastic contact pieces 43 and 44 and the second elastic contact pieces 45 and 46.

In the description of this embodiment, the pin plug 22 having a circular cross-sectional shape is taken as an example of the terminal held by the connection terminals 17 and 81. Alternatively, the blade 86 of a flat plate shape illustrated in FIG. 16 may be used as the terminal held by the connection terminals 17 and 81.

In this case, as illustrated in FIG. 17, the first contact parts 67 and 71 provided in the first elastic contact pieces 43 and 44, respectively, and the second contact parts 69 and 72 provided in the second elastic contact pieces 45 and 46, respectively, come into contact with side surfaces of the blade 86.

The present invention may be applied to a connection terminal that electrically connects to a terminal by coming into contact with the terminal, and to an AC adapter including the connection terminal.

According to one aspect of the present invention, a connection terminal (17) to electrically connect to a terminal (22) by holding the terminal (22) is provided that includes a frame body (41) including a first support part (51) and a second support part (52) positioned to face each other; and a third support part (53) having a first end and a second end connected to an end of the first support part (51) and an end of the second support part (52), respectively; multiple first elastic contact pieces (43, 44) provided on the first support part (51) on a first side from which the terminal (22) is to be inserted and having respective first contact parts (67, 71) configured to contact the peripheral surface of the terminal (22); multiple second elastic contact pieces (45, 46) provided on the second support part (52) on the first side and having respective second contact parts (69, 72) configured to contact the peripheral surface of the terminal (22), the second contact parts (69, 72) being positioned to face the first contact parts (67, 71); and a third elastic contact piece (48) provided on the frame body (41) on a second side opposite to the first side and configured to contact an end portion of the terminal (22).

By thus providing the frame body (41) including the first support part (51) and the second support part (52) positioned to face each other; and the third support part (53) having a first end and a second end connected to an end of the first support part (51) and an end of the second support part (52), respectively; the first elastic contact pieces (43, 44) provided on the first support part (51) on the first side from which the terminal (22) is to be inserted and having their respective first contact parts (67, 71) configured to contact the peripheral surface of the terminal (22); the second elastic contact pieces (45, 46) provided on the second support part (52) on the first side and having their respective second contact parts (69, 72) configured to contact the peripheral surface of the terminal (22), the second contact parts (69, 72) being positioned to face the first contact parts (67, 71); and the third elastic contact piece (48) provided on the frame body (41) on a second side opposite to the first side and configured to contact an end portion of the terminal (22), it is possible to hold the terminal (22) at a total of five points: one at the end of the terminal (22) to be inserted into the connection terminal (17) and four at the peripheral surface of the terminal (22), and to prevent an increase in the interval between the first support part (51), on which the first elastic contact pieces (43, 44) are provided, and the second support part (52), on which the second elastic contact pieces (45, 46) are provided (in other words, an increase in the gap between the first elastic contact pieces (43, 44) and the second elastic contact pieces (45, 46)). Accordingly, it is possible to increase the reliability of the electrical connection between the connection terminal (17) and the terminal (22) by ensuring the holding of the terminal (22) by the connection terminal (17).

The first elastic contact pieces (43, 44) may be curved in shape to project in a direction toward the second elastic contact pieces (45, 46), the second elastic contact pieces (45, 46) may be curved in shape to project in a direction toward the first elastic contact pieces (43, 44), the first contact parts (67, 71) may be positioned where an interval between the first elastic contact pieces (43, 44) and the second elastic contact pieces (45, 46) is narrowest in the first elastic contact pieces (43, 44), and the second contact parts (69, 72) may be positioned where the interval between the first elastic contact pieces (43, 44) and the second elastic contact pieces (45, 46) is narrowest in the second elastic contact pieces (45, 46).

By thus providing the first elastic contact pieces (43, 44) and the second elastic contact pieces (45, 46) with a curved shape, it is possible to guide the terminal (22) into the connection terminal (17) so that the end portion of the terminal (22) comes into contact with the third elastic contact piece (48), even if the terminal 22 is slightly out of alignment with the connection terminal (17). This makes it possible to ensure the holding of the terminal (22) by the connection terminal (17).

Further, a first support body (83) connecting respective end parts of the first elastic contact pieces (43, 44) and a second support body (84) connecting respective end parts of the second elastic contact pieces (45, 46) may be provided.

This makes it possible to maintain the gap between the first elastic contact pieces (43, 44) at a constant value and to maintain the gap between the second elastic contact pieces (45, 46) at a constant value. Accordingly, it is possible to ensure laterally holding the terminal (22) between the first elastic contact pieces (43, 44) and the second elastic contact pieces (45, 46).

According to one aspect of the present invention, an AC adapter (10) is provided that includes the connection terminal (17) as set forth above; a circuit board (14) having an interconnection pattern (34); an electronic component (15) mounted on the circuit board (14); a power supply plug (11) including a first case (21) and a pin plug (22) penetrating through the first case (21), the first case (21) being attached to the circuit board (14); and a second case (12) attached to the power supply plug (11), the second case (12) including a housing part (28) configured to house the circuit board (14) having the electronic component (15) mounted thereon, wherein the connection terminal (17) is provided on the circuit board (14) so that the pin plug (22) faces the third elastic contact piece (48) and is electrically connected to the interconnection pattern (34), and the connection terminal (17) holds the pin plug (22) so that the first contact parts (67, 71), the second contact parts (69, 72), and the third elastic contact piece (48) are in contact with the end portion of the pin plug (22).

By providing the connection terminal (17) on the circuit board (14) so that the pin plug (22) faces the third elastic contact piece (48) and is electrically connected to the interconnection pattern (34) and that the first contact parts (67, 71), the second contact parts (69, 72), and the third elastic contact piece (48) are in contact with the end portion of the pin plug (22), it is possible to ensure the holding of the pin plug (22) by the connection terminal (17). As a result, it is possible to increase the reliability of the electrical connection between the pin plug (22) and the connection terminal (17).

The above-described parenthesized numerals are provided for reference purposes only, and do not limit the embodiment of the present invention to the graphically illustrated configurations.

What is claimed is:

1. A connection terminal to electrically connect to another terminal, the connection terminal comprising:

a frame body including a first support part and a second support part positioned to face each other; and a third support part having a first end and a second end connected to an end of the first support part and an end of the second support part, respectively;

a plurality of first elastic contact pieces provided on the first support part on a first side from which said another terminal is to be inserted into the connection terminal and having respective first contact parts;

a plurality of second elastic contact pieces provided on the second support part on the first side and having respective second contact parts, the second contact parts being positioned to face the first contact parts; and a third elastic contact piece provided on the frame body on a second side opposite to the first side and configured to contact an end portion of said another terminal, wherein the first contact parts and the second contact parts are configured to contact a peripheral surface of said another terminal to hold said another terminal between the first contact parts and the second contact parts.

2. The connection terminal as claimed in claim 1, wherein the first elastic contact pieces are curved in shape to project in a direction toward the second elastic contact pieces, the second elastic contact pieces are curved in shape to project in a direction toward the first elastic contact pieces, the first contact parts are positioned where an interval between the first elastic contact pieces and the second elastic contact pieces is narrowest in the first elastic contact pieces, and the second contact parts are positioned where the interval between the first elastic contact pieces and the second elastic contact pieces is narrowest in the second elastic contact pieces.

3. The connection terminal as claimed in claim 1, further comprising:

a first support body connecting respective end parts of the first elastic contact pieces; and a second support body connecting respective end parts of the second elastic contact pieces.

4. An AC adapter, comprising:

the connection terminal as set forth in claim 1;

a circuit board having an interconnection pattern;

an electronic component mounted on the circuit board;

a power supply plug including a first case and a pin plug penetrating through the first case, the first case being attached to the circuit board; and a second case attached to the power supply plug, the second case including a housing part configured to house the circuit board having the electronic component mounted thereon, wherein the connection terminal is provided on the circuit board so that the pin plug faces the third elastic contact piece and is electrically connected to the interconnection pattern, and the connection terminal holds the pin plug so that the first contact parts, the second contact parts, and the third elastic contact piece are in contact with the end portion of the pin plug.

* * * * *